United States Patent [19]

Roesner

[11] Patent Number: 4,783,238

[45] Date of Patent: Nov. 8, 1988

[54] PLANARIZED INSULATION ISOLATION

[75] Inventor: Bruce Roesner, San Diego, Calif.

[73] Assignee: Hughes Aircraft Company, Los Angeles, Calif.

[21] Appl. No.: 80,271

[22] Filed: Jul. 31, 1987

[51] Int. Cl.$^4$ .......................................... H01L 21/312
[52] U.S. Cl. ..................... 156/649; 156/668; 437/61; 437/228; 437/229; 437/231; 430/314; 430/317
[58] Field of Search .............. 156/643, 648, 649, 668; 437/61, 67, 228, 231, 243, 974, 229; 430/314, 317

[56] References Cited

U.S. PATENT DOCUMENTS

| 4,545,852 | 10/1985 | Barton | 156/643 |
| 4,596,071 | 6/1986 | Kita | 156/648 X |
| 4,662,986 | 5/1987 | Lim | 156/643 |

FOREIGN PATENT DOCUMENTS

| 0055521 | 7/1982 | European Pat. Off. | 437/67 |
| 60-132341 | 7/1985 | Japan | 437/67 |

OTHER PUBLICATIONS

Tsang, "Forming Wide Trench Dielectric Isolation", IBM TDB, vol. 25, No. 11B, pp. 6129-6130, Apr. 1983.

Primary Examiner—David L. Lacey
Assistant Examiner—Andrew J. Anderson
Attorney, Agent, or Firm—Kenneth W. Float; A. W. Karambelas

[57] ABSTRACT

A process for fabricating semiconductor integrated circuits which include active regions having well defined mesa structures which maintain their size during processing. Mesa structures are formed in the top portion of a semiconductor substrate, and an insulating layer is formed on the top portion of the semiconductor. Active regions are defined in the semiconductor substrate which include the mesa regions where active devices are to be formed, the remaining regions of the semiconductor substrate being non-active regions. Photoresist is selectively applied on the insulating layer over the non-active regions to maintain exposed insulating layer portions over the mesa structures. The photoresist and the exposed insulating layer portions are etched to thin or remove the exposed insulating layer portions while maintaining the thickness of the covered insulating portions.

9 Claims, 2 Drawing Sheets

PLANARIZED INSULATION ISOLATION

BACKGROUND OF THE INVENTION

The disclosed invention generally relates to the fabrication of integrated circuits, and is more particularly directed to a process for maintaining well defined mesa structures and also for maintaining the thickness of oxide over non-active regions while oxide over the active regions is thinned.

In certain known processes for fabricating semiconductor integrated circuits, mesa structures are formed where active devices are to be located. See, for example, "Local Oxidation of Silicon and Its Application in Semiconductor-Device Technology," Appels et al., *Philips Res. Repts.* 25, 118–132, 1970. After the mesa structures are formed, field oxide is grown and gate oxide is formed. However, in the course of such oxide processing, the mesa structures become narrower in width and less defined as a result of encroachment. Further, gate oxide formation involves etching to thin the oxide, which results in thinning of the field oxide over the no-active regions.

Encroachment and thinning of the field oxide limit the reduction of circuit dimensions. Particularly, mesa structures must be sufficiently wide to compensate for encroachment. Further, thinning of the field oxide over the non-active regions causes increased capacitance, which results in reduced performance. Reduction of circuit dimensions necessarily results in reduced oxide thickness, thereby placing a limit on circuit dimension reduction.

SUMMARY OF THE INVENTION

It would therefore be an advantage to provide a process for fabricating semiconductor integrated circuits which provides for well defined mesa structures.

It would also be an advantage to provide a process for fabricating semiconductor integrated circuits which reduces encroachment on mesa structures.

Another advantage would be to provide a process for fabricating semiconductor integrated circuits which avoids increasing capacitance as a result of the formation of gate oxide over mesa structured active areas.

It would also be an advantage to provide a process for fabricating semiconductor integrated circuits which maintains oxide thickness over non-active regions adjacent mesa structured active regions.

The foregoing and other advantages and features are provided by the invention in a process which includes the steps of forming mesa structures in the top portion of a semiconductor substrate, and forming a thick insulating layer on the top portion of the semiconductor. Active regions are defined in the semiconductor substrate which include the mesa regions where active devices are to be formed, the remaining regions of the semiconductor substrate being non-active regions. An undersized reverse mask photoresist layer and a planarizing photoresist layer are applied on the insulating layer over the non-active regions to maintain exposed insulating layer portions over the mesa structures exposed. Particularly, the undersized photoresist layer is an undersized reverse of the active region mesa structure mask. The planarizing photoresist layer is applied to fill gaps between the undersized photoresist layer and the sides of the insulating layer portions over the mesa structures, thereby cooperating with the undersized photoresist layer to provide a planarized photoresist layer. The planarized photoresist layer and the exposed insulating layer portions are etched to thin or remove the exposed insulating layer portions while maintaining the thickness of the covered insulating portions. This results in relatively thick insulating regions between the mesa structures.

BRIEF DESCRIPTION OF THE DRAWING

The advantage and features of the disclosed invention will readily be appreciated by persons skilled in the art from the following detailed description when read in conjunction with the drawing wherein.

DETAILED DESCRIPTION

Figure 1A:
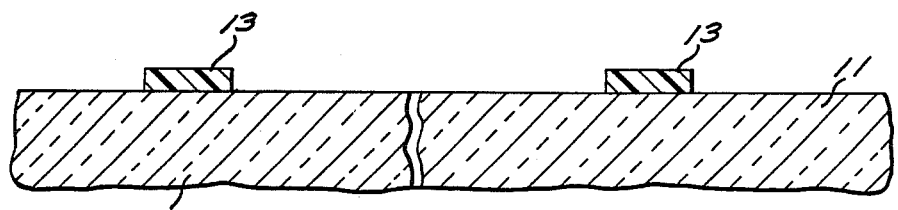
FIGS. 1A through 1G are partial sectional views schematically illustrating the processing steps of the invention.

In the following detailed description and in the several figures of the drawing, like elements are identified with like reference numerals.

Figure 1B:
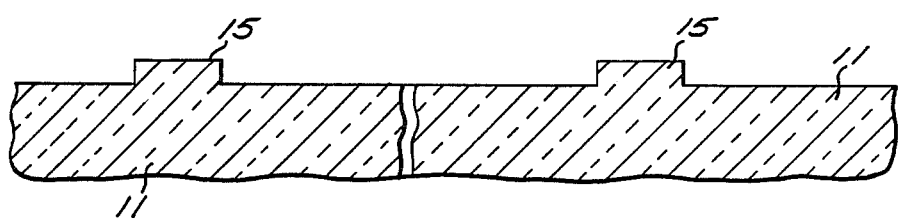

Referring now to FIG. 1A, a semiconductor substrate 11 is provided, and photoresist 13 is a selectively applied to protect the active areas where the mesas are to be formed. The substrate with the photoresist is then etched, for example by plasma etching, to provide the mesa structures 15 shown in FIG. 1B, which illustrates the resulting structure after the photoresist has been removed.

By chemical vapor deposition, an insulating layer, for example oxide, is uniformly formed over the top portion of the substrate 11, including the mesa structures 15. The resulting structure including an insulating layer 17 is illustrated in FIG. 1C.

Figure 1C:
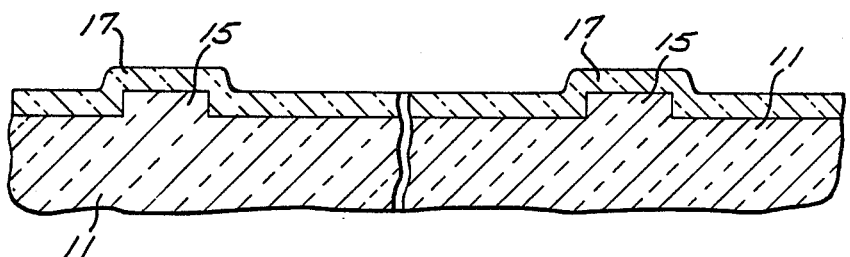
Figure 1D:
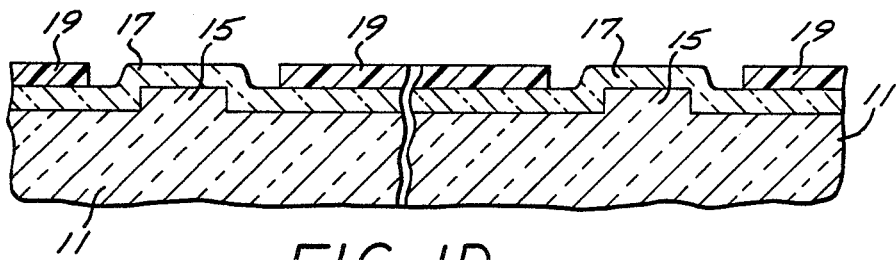

A undersized photoresist layer 19 is selectively applied to the structure of FIG. 1C over the non-active areas between the mesa structures 15 to provide the structure of FIG. 1D. As shown, the first photoresist layer 19 does not cover the entire non-active regions between the mesa structures 15, having a pattern that is the reverse of the active regions mask pattern initially applied and undersized.

By way of example, the undersized photoresist layer 19 can be formed by a "spin-on" procedure. The substrate 11 is secured in a rotating chuck for rotation about an axis orthogonal to the planar orientation of the substrate, for example within a photoresist deposition chamber. Photoresist is applied on the insulating layer 17, and the substrate is rotated at a slow speed to obtain a uniform photoresist layer. Subsequently, the substrate is rotated at a higher speed to remove excess photoresist and to dry the applied photoresist layer. This procedure creates a generally uniform photoresist layer on the insulating layer 17. The photoresist layer is then masked, exposed, and developed to produce the undersized photoresist layer 19. Such mask processing results in gaps between the exposed portions of the insulating layer 17 on the sides of the mesa structures and the undersized photoresist layer 19.

A planarizing photoresist layer 21 is selectively applied to the structure of FIG. 1D over the insulating layer 17 in the gaps between the undersized photoresist layer 19 and the sides of the raised portions of the insulating layer 17 over the mesa structures 15. The resulting structure is shown in FIG. 1D. The planarizing photoresist layer 21 can be applied in a manner which yields a non-uniform distribution to fill the gaps between the undersized photoresist layer 19 and the exposed portions of the sides of the raised portions of the insulating layer 17, thereby providing for a planarized photoresist layer comprising the undersized photoresist layer 19 and the planarizing photoresist layer 21. For example, the planarizing photoresist layer 21 can be formed by applying photoresist material and spinning it on with only high speed rotation. This causes the photoresist material to migrate into the gaps while substantially avoiding deposits on the undersized photoresist layer 19 and the planar surfaces of the exposed insulating layer portions over the mesa structures.

Figure 1E:
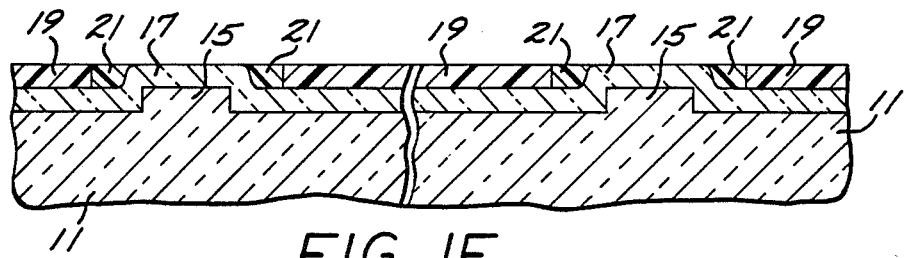
Figure 1F:
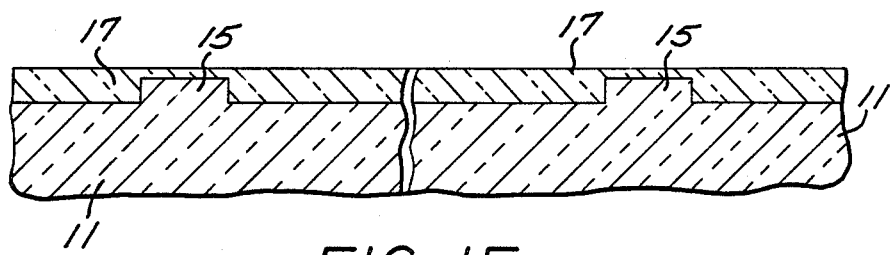

The photoresist layers and the exposed oxide of the structure of FIG. 1E are dry etched at approximately the same rate to thin the oxide over the mesa structures. The resulting semiconductor structure is shown in FIG. 1F. The dry etch may be achieved, for example, by plasma etching. The exposed oxide over the mesa structures 11 is thinned, while the thickness of the oxide over the non-active regions is maintained since it was protected by the photoresist layers 19, 21. If desired, additional wet etching may be employed to remove the oxide over the mesa structures to result in the structure shown in FIG. 1G, while still maintaining the thickness of the oxide over the non-active regions.

Figure 1G:
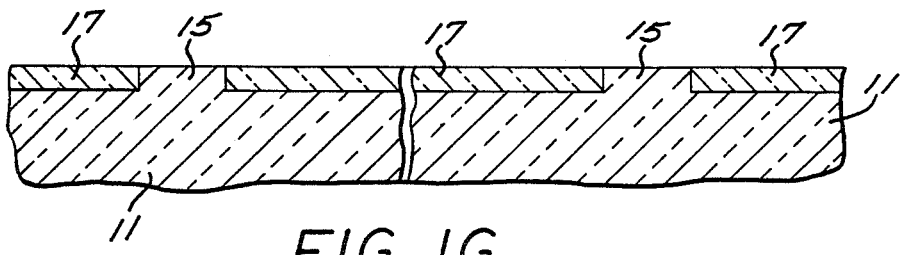

The structures of FIGS. 1F and 1G are now ready for standard device processing, including, for example, gate oxide growths, deposition, ion implantation, and so forth.

The foregoing has been a disclosure of a process which provides for well-defined mesas and reduces encroachment on mesa structures during processing. The disclosed process further maintains oxide thickness over non-active regions in the fabrication of integrated circuits having mesa structures. As result of these advantages, mesa dimensions are precisely controlled and capacitance due to the non-active regions is not increased, which allows for reduced circuit dimensions.

Although the foregoing has been a description and illustration of specific embodiments of the invention, various modifications and changes thereto can be made by persons skilled in the art without departing from the scope and spirit of the invention as defined by the following claims.

What is claimed is:

1. A method of processing an integrated circuit which provides for improved planarized insulation isolation, said circuit having a semiconductor substrate with mesa structures in the surface thereof which define active areas therein, said method comprising the steps of:
    disposing an insulating layer over the surface of said substrate which covers both active and nonactive areas thereof;
    disposing an undersized photoresist layer over said insulating layer substantially above the nonactive areas of the substrate such that gaps are provided between the undersized photoresist layer and the portions of the insulting layer disposed over the active areas of the substrate;
    disposing photoresist material in the gaps to form a planarized photoresist layer which extends between the active areas and does not cover the portions of the insulating layer over the active areas; and
    simultaneously etching the portions of the insulating layer disposed over the active areas and the planarized photoresist layer at a rate which substantially thins the insulating layer portions while maintaining the thickness of the insulating layer over the nonactive areas of the substrate.

2. The method of claim 1 wherein the step of disposing the undersized photoresist layer over the surface of the substrate comprises:
    depositing photoresist material on the surface of said substrate;
    rotating said substrate at a relatively slow speed to create a uniform photoresist layer on the surface;
    rotating said substrate at a higher speed to dry the photoresist layer and remove excess photoresist material;
    masking said photoresist layer to produce the desired undersized photoresist pattern;
    exposing said masked photoresist layer; and
    developing said exposed photoresist layer to produce said undersized photoresist layer.

3. The method of claim 1 wherein the step of disposing the photoresist material in the gaps comprises:
    depositing photoresist material on the surface of said substrate;
    rotating said substrate at a high speed to deposit said photoresist material in the gaps.

4. A method for processing an integrated circuit which provides for improved planarized insulation isolation, said circuit having a semiconductor substrate with mesa structures in the surface thereof which defines active areas therein, said method comprising the steps of:
    disposing an insulating layer over the surface of said substrate which covers both active and nonactive areas thereof;
    disposing an undersized photoresist layer over said insulating layer substantially above the nonactive areas of the substrate such that gaps are provided between the undersized photoresist layer and the portions of the insulating layer disposed over the active areas of the substrate;
    disposing photoresist material in the gaps to form a planarized photoresist layer which extends between the active areas and does not cover the portions of the insulating layer over the active areas which remain exposed; and
    simultaneously etching the portions of the insulating layer disposed over the active areas and the planarized photoresist layer at a rate which substantially exposes the surface of the mesa structures while maintaining the thickness of the insulating layer over the nonactive areas of the substrate.

5. A process for fabricating an integrated circuit comprising the steps of:
    forming mesa structures in the top surface of a semiconductor substrate;
    forming an insulating layer on the top surface of the semiconductor substrate;
    defining active regions in the semiconductor substrate including the mesa regions where active devices are to be formed, the remaining regions of the semiconductor substrate being nonactive regions;
    forming an undersized photoresist layer on the insulating layer over the nonactive regions except in the proximity of the active regions such that gaps are formed between the undersized photoresist layer and the portions of the insulating layer disposed over the mesa structures;
    depositing planarizing photoresist material in the gaps to form a planarized photoresist layer which comprises the undersized photoresist layer and the planarizing photoresist material and which does not cover the portions of the insulating layer disposed over the mesa structures; and etching the planarized photoresist layer and the portions of the insulating layer disposed over the mesa structures to thin the insulating layer portions disposed over the mesa structures while maintaining the thickness of the insulating layer covered by the planarized photoresist layer.

6. The process of claim 5 wherein the step of forming an insulating layer includes the step of chemically depositing said insulating layer.

7. The process of claim 6 wherein said step of chemically depositing includes the step of chemical vapor depositing an oxide layer.

8. The process of claim 5 wherein the step of forming an undersized photoresist layer includes the steps of:

depositing photoresist material on the insulating layer;

rotating the substrate at a relatively slow speed to provide a uniform photoresist coating over the insulating layer;

rotating the substrate at a higher speed to remove excess photoresist material and to dry the photoresist;

applying a mask to the photoresist coating to produce the desired undersized photoresist pattern; and exposing and developing the masked photoresist coating to produce the undersized photoresist layer.

9. The process of claim 8 wherein the step of forming a planarizing photoresist layer includes the steps of:

depositing photoresist material on the undersized photoresist layer and the exposed insulating layer;

rotating the substrate at a high speed to deposit the photoresist material in the gaps between the undersized photoresist layer and the insulating layer disposed over the mesa structures.

* * * * *